(12) United States Patent
Lim et al.

(10) Patent No.: US 8,581,231 B2
(45) Date of Patent: Nov. 12, 2013

(54) LIGHT EMITTING DEVICE WITH ELECTRODE HAVING PLURALITY OF ADHESIVE SEEDS SPACED FROM ONE ANOTHER ON THE LIGHT EMITTING STRUCTURE

(75) Inventors: Woosik Lim, Seoul (KR); Juneo Song, Seoul (KR); Sungho Choo, Seoul (KR); Hyunseoung Ju, Seoul (KR); Myeongsoo Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/486,832

(22) Filed: Jun. 1, 2012

(65) Prior Publication Data

US 2012/0305889 A1    Dec. 6, 2012

(30) Foreign Application Priority Data

Jun. 2, 2011   (KR) .................. 10-2011-0053361

(51) Int. Cl.
*H01L 33/08* (2010.01)
(52) U.S. Cl.
USPC ............. 257/13; 257/98; 257/99; 257/103; 257/E33.008

(58) Field of Classification Search
USPC ................. 257/13, 98, 99, 103, E33.008
See application file for complete search history.

(56) References Cited

U.S. PATENT DOCUMENTS

| 8,426,887 B2 * | 4/2013 | Son .............................. 257/103 |
| 2007/0023777 A1 * | 2/2007 | Sonobe et al. ................ 257/103 |
| 2011/0198564 A1 * | 8/2011 | Son ................................. 257/13 |

* cited by examiner

*Primary Examiner* — Thanh V Pham
(74) *Attorney, Agent, or Firm* — Birch, Stewart, Kolasch & Birch, LLP

(57) ABSTRACT

Disclosed is a light emitting device including a light emitting structure including a first conductive-type semiconductor layer, a second conductive-type semiconductor layer and an active layer interposed between the first conductive-type semiconductor layer and the second conductive-type semiconductor layer, a first electrode layer electrically connected to the first conductive-type semiconductor layer, and a second electrode layer disposed on the second conductive-type semiconductor layer, wherein the second electrode layer includes a plurality of adhesive seeds spaced from one another on the light emitting structure, a reflective layer disposed on the plurality of adhesive seeds, and a protective layer disposed on the reflective layer, wherein the reflective layer contains silver (Ag) or an Ag alloy. As a result, it is possible to improve light reflectance and electrical properties of the electrode layer of the light emitting device and reliability of the electrode layer.

20 Claims, 12 Drawing Sheets

| (A) Cr/Al/Ni/Au | R: 82.75% |
| (B) Cr/Ag/Ni/Au | R: 86.81% |
| (C) Cr/AgCu/Ni/Au | R: 86.66% |

# LIGHT EMITTING DEVICE WITH ELECTRODE HAVING PLURALITY OF ADHESIVE SEEDS SPACED FROM ONE ANOTHER ON THE LIGHT EMITTING STRUCTURE

CROSS-REFERENCE TO RELATED APPLICATION

This application claims the priority benefit of Korean Patent Application No. 10-2011-0053361, filed on Jun. 2, 2011 in the Korean Intellectual Property Office, the disclosure of which is incorporated herein by reference.

BACKGROUND

1. Field

Embodiments relate to a light emitting device.

2. Description of the Related Art

Light emitting devices such as light emitting diodes or laser diodes using Group III-V or II-IV compound semiconductor materials can render a variety of colors such as red, green, blue and UV light through development of thin film growth techniques and device materials and can realize white light with superior efficiency by using a fluorescent material or combining colors.

An application range of these light emitting devices is gradually expanding owing to advantages such as low power consumption, semi-permanent lifespan, rapid response rate, safety and environmental friendliness, as compared to conventional light sources such as fluorescent lamps and incandescent lamps. The expansion in application range of light emitting devices causes an increase in brightness required for lamps for households, lamps for distress calls and the like. Accordingly, it is important to increase efficiency of light emitting devices.

SUMMARY

Therefore, embodiments have been made in view of the above problems, and it is an object of embodiments to provide a light emitting device with improved reliability.

In accordance with one aspect, provided is a light emitting device including: a light emitting structure including a first conductive-type semiconductor layer, a second conductive-type semiconductor layer and an active layer interposed between the first conductive-type semiconductor layer and the second conductive-type semiconductor layer; a first electrode layer electrically connected to the first conductive-type semiconductor layer; and a second electrode layer disposed on the second conductive-type semiconductor layer, wherein the second electrode layer includes: a plurality of adhesive seeds spaced from one another on the light emitting structure; a reflective layer disposed on the plurality of adhesive seeds; and a protective layer disposed on the reflective layer, wherein the reflective layer contains silver (Ag) or an Ag alloy.

The Ag alloy may contain silver and at least one of Cu, Re, Bi, Al, Zn, W, Sn, In and Ni.

The first conductive-type semiconductor layer may be an n-type semiconductor layer and the first conductive-type semiconductor layer and the first electrode layer may constitute an ohmic contact.

The light emitting device may further comprise a wire bonding layer disposed on the protective layer.

BRIEF DESCRIPTION OF THE DRAWINGS

The above and other objects, features and other advantages of embodiments will be more clearly understood from the following detailed description taken in conjunction with the accompanying drawings, in which.

DETAILED DESCRIPTION OF THE PREFERRED EMBODIMENTS

Figure 1:
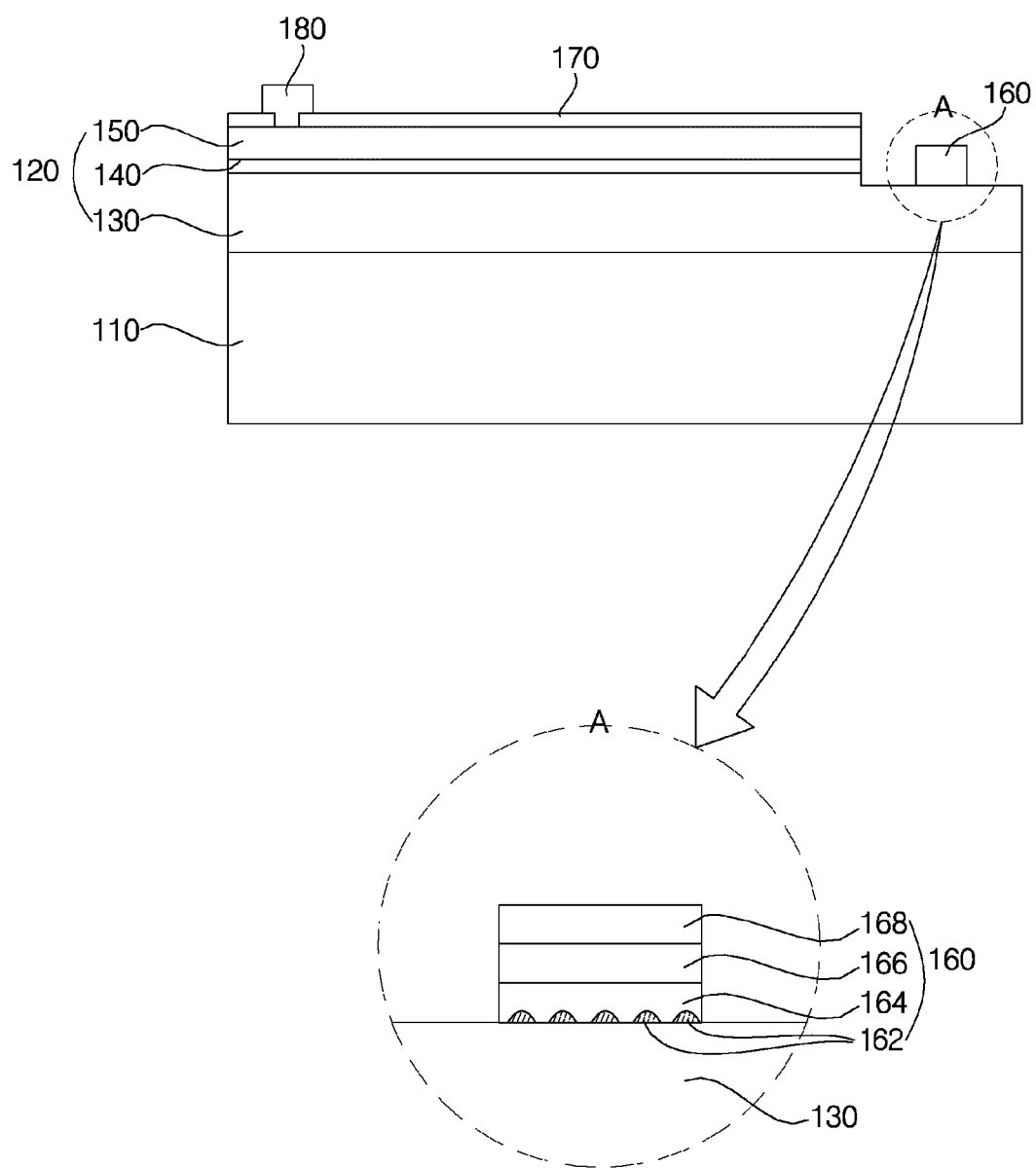
FIG. 1 is a sectional view illustrating a light emitting device according to one embodiment.

Reference will now be made in detail to the preferred embodiments, examples of which are illustrated in the accompanying drawings. Wherever possible, the same reference numbers will be used throughout the drawings to refer to the same or like parts.

Prior to description of the embodiments, it will be understood that, when an element such as a layer (film), region, pattern, or structure is referred to as being formed "on" or "under" another element, such as a substrate, layer (film), region, pad, or pattern, it can be directly "on" or "under" the other element or be indirectly formed with intervening elements therebetween. Further, "on" or "under" of each layer will be described based on illustration in the drawings.

In the drawings, the thicknesses or sizes of respective layers are exaggerated, omitted or schematically illustrated for clarity and convenience of description. Therefore, the sizes of respective elements do not wholly reflect actual sizes thereof.

Hereinafter, embodiments will be described in more detail with reference to the annexed drawings.

FIG. 1 is a sectional view illustrating a light emitting device according to one embodiment.

Referring to FIG. 1, the light emitting device 100 according to this embodiment includes a substrate 110 and a light emitting structure 120 disposed on the substrate 110.

The substrate 110 may be a conductive substrate or an insulating substrate, and is for example made of at least one of sapphire ($Al_2O_3$), SiC, Si, GaAs, GaN, ZnO, Si, GaP, InP, Ge, and $Ga_2O_3$.

Impurities present on the surface of the substrate 110 may be first removed by wet-washing or the surface of the substrate 110 may be patterned (patterned substrate, PSS) in order to improve light extraction effects, but are not limited thereto.

Meanwhile, although not shown, a buffer layer (not shown) is disposed on the substrate 110, thus reducing lattice mismatch and difference in coefficient of thermal expansion between the substrate 110 and the first conductive-type semiconductor layer 120 and the like.

The buffer layer (not shown) may be made of a Group III-V compound semiconductor. For example, the buffer layer (not shown) may be made of at least one of GaN, InN, AlN, InGaN, AlGaN, InAlGaN and AlInN and may be obtained by injecting trimethyl gallium (TMGa) gas, trimethyl indium (TMIn) gas and trimethyl aluminum gas (TMAl) together with hydrogen gas ($H_2$) and ammonia gas ($NH_3$), followed by growth. In addition, an undoped semiconductor layer (not shown) may be further disposed on the buffer layer (not shown), but is not limited thereto.

The light emitting structure 120 is disposed on the substrate 110, includes the first conductive-type semiconductor layer 130, the active layer 140 and the second conductive-type semiconductor layer 150, and has a structure in which the active layer 140 is interposed between the first conductive-type semiconductor layer 130 and the second conductive-type semiconductor layer 150.

The first conductive-type semiconductor layer 130 may be made of one or more of a semiconductor material having the formula of $In_xAl_yGa_{1-x-y}N$ ($0 \leq x \leq 1$, $0 \leq y \leq 1$, $0 \leq x+y \leq 1$), such as GaN, InN, AlN, InGaN, AlGaN, InAlGaN, AlInN, AlGaAs, InGaAs, AlInGaAs, GaP, AlGaP, InGaP, AlInGaP and InP. In addition, when the first conductive-type semiconductor layer 120 is for example an n-type semiconductor layer, it may contain Si, Ge, Sn, Se, Te or the like as an n-type dopant.

The first conductive-type semiconductor layer 130 may be formed by injecting gas such as trimethyl gallium gas (TMGa), ammonia gas ($NH_3$), nitrogen gas (N2) and silane gas ($SiH_4$) containing an n-type impurity such as silicon (Si) into a chamber, but the formation method thereof is not limited thereto.

The active layer 140 emits light corresponding to an energy determined by inherent energy bands, when electrons and holes injected through the first conductive-type semiconductor layer 130 and the second conductive-type semiconductor layer 150 combine with each other.

The active layer 140 may for example be grown by injecting trimethyl gallium gas (TMGa) and trimethyl indium gas (TMIn) under a nitrogen atmosphere and may be formed with at least one of a mono- or multi-quantum well structure, a quantum wire structure, a quantum dot structure or the like.

Meanwhile, the well layer/barrier layer of the active layer 140 may have a pair structure of one or more of InGaN/GaN, InGaN/InGaN, GaN/AlGaN, InAlGaN/GaN, GaAs(InGaAs)/AlGaAs, and GaP(InGaP)/AlGaP, but the structure thereof is not limited thereto. The well layer may be made of a material that has a narrower band gap than a barrier layer.

The second conductive-type semiconductor layer 150 may contain a group III-V compound semiconductor doped with a second conductive-type dopant such as a semiconductor material having a formula of $In_xAl_yGa_{1-x-y}N$ ($0 \leq x \leq 1$, $0 \leq y \leq 1$, $0 \leq x+y \leq 1$). When the second conductive-type semiconductor layer 150 is a p-type semiconductor layer, the second conductive-type dopant may contain Mg, Zn, Ca, Sr, Ba or the like as a p-type dopant.

The second conductive-type semiconductor layer 150 may be grown by injecting hydrogen, trimethyl gallium gas (TMGa), trimethyl aluminum gas (TMAl), or bicetylcyclopentadienyl magnesium ($EtCp_2Mg$) {$Mg(C_2H_5C_5H_4)_2$} as a carrier gas into a chamber, without being limited thereto.

Meanwhile, the buffer layer (not shown), the first conductive-type semiconductor layer 130, the active layer 140 and the second conductive-type semiconductor layer 150 may be formed by a method such as metal organic chemical vapor deposition (MOCVD), chemical vapor deposition (CVD), plasma-enhanced chemical vapor deposition (PECVD), molecular beam epitaxy (MBE) and hydride vapor phase epitaxy (HVPE), without being limited thereto.

In addition, the first semiconductor layer 130 may be realized by a p-type semiconductor layer and the second semiconductor layer 150 may be realized by an n-type semiconductor layer. Another semiconductor layer (not shown) with a polarity opposite that of the first semiconductor layer 120 is further present, to form an N-P junction, P-N junction, N-P-N junction or P-N-P junction structure, without being limited thereto.

Referring to FIG. 1, when the upper surface of the first conductive-type semiconductor layer 130 is partially exposed by mesa-etching a region that extends from the second conductive-type semiconductor layer 150 and a part of the first conductive-type semiconductor layer 130 by reactive ion etching (RIE) or the like, a first electrode layer 160 is formed on the upper surface of the exposed first conductive-type semiconductor layer 130.

Referring to the region A of FIG. 1, the first electrode layer 160 may include an adhesive seed 162, a reflective layer 164 and a protective layer 166. In addition, as mentioned below, the first electrode layer 160 may further include a wire bonding layer 168 to which wires are connected during manufacture of the light emitting device package (not shown).

A plurality of adhesive seeds 162 may be spaced from one another on the light emitting structure 120. For example, as shown in FIG. 1, the adhesive seeds 162 may be disposed on the upper surface of the exposed first conductive-type semiconductor layer 130.

The adhesive seed 162 is formed of at least one of Cr, Ti, V, Ta and Al and improves adhesive force between the first electrode layer 160 and the first conductive-type semiconductor layer 130 and suppresses excessive diffusion and movement of silver contained in the reflective layer 164. In addition, the protective layer 166 is formed of at least one of Cr, Ti, Ni, Pd, Pt, W, Co, and Cu, and suppresses excessive injection of exterior oxygen and excessive diffusion of silver particles and thereby prevents aggregation and emptiness of silver.

Meanwhile, the adhesive seed 162, the reflective layer 164, and the protective layer 166 may be sequentially deposited, or simultaneously formed, without being limited thereto.

In addition, the adhesive seed 162 may be a solid solution produced in the process of forming a thin film on the first conductive-type semiconductor layer 130 and heating the same.

When the first electrode layer 160 is subjected to thermal treatment, silver alloy particles diffused into the reflective layer 164 and particles of Ga or the like diffused into the first conductive-type semiconductor layer 130 undergo metallization at the interface between the first electrode layer 160 and the first conductive-type semiconductor layer 130, and a low contact resistance and strong adhesive force can thus be imparted to the first electrode layer 160.

In addition, since silver does not undergo galvanic corrosion or the like, and the adhesive seed 162 and the protective layer 166 prevent excessive diffusion of silver particles by thermal treatment, the first electrode layer 160 can maintain high light reflectivity, an inherent property of silver.

The reflective layer 164 may be made of an Ag alloy.

The reflective layer 164 contains silver (Ag) with high reflectivity, thereby improving light extraction efficiency to the outside. In addition, by forming the reflective layer 164 with an Ag alloy, it is possible to prevent a decrease in Vf caused by thermal treatment of the first electrode layer 160, and galvanic corrosion caused by contact potential difference or the like.

Meanwhile, when the first conductive-type semiconductor layer 130 is realized with an n-type semiconductor layer and the reflective layer 164 is made of silver, formation of ohmic contact between the first electrode layer 160 and the first conductive-type semiconductor layer 130 may be difficult. However, the reflective layer 164 contains an Ag alloy, thereby securing high reflectivity based on Ag, and forming ohmic contact between the first conductive-type semiconductor layer 130 and the first electrode layer 160.

Meanwhile, the Ag alloy contains silver (Ag) and at least one of Cu, Re, Bi, Al, Zn, W, Sn, In and Ni, without being limited thereto.

The thickness of the reflective layer 164 is not limited and may be greater than that of the adhesive seed 162.

The reflective layer 164 may be disposed such that it contacts the light emitting structure 120. That is, as shown in FIG. 1, one part of the reflective layer 164 may contact the first conductive-type semiconductor layer 130. The one part of the reflective layer 164 may come into ohmic-contact with the first conductive-type semiconductor layer 130.

Meanwhile, the wire bonding layer 168 may be formed so that a wire connected for application of exterior power is bonded, when the light emitting device 100 is mounted on the light emitting device package (not shown). Meanwhile, the wire bonding layer 168 may be formed of gold, or the like, without being limited thereto.

Referring to FIG. 1, a light-transmitting electrode layer 170 is formed on the second conductive-type semiconductor layer 150 and a second electrode layer 180 is formed on one outer surface of the light-transmitting electrode layer 170.

The light-transmitting electrode layer 170 contains at least one of ITO, IZO(In—ZnO), GZO(Ga—ZnO), AZO(Al—ZnO), AGZO(Al—Ga ZnO), IGZO(In—Ga ZnO), IrOx, RuOx, RuOx/ITO, Ni/IrOx/Au and Ni/IrOx/Au/ITO, is disposed throughout one outer surface of the second conductive-type semiconductor layer 150 and distributes power applied from the outside, thereby supplying the same to the second conductive-type semiconductor layer 150.

Meanwhile, as shown in FIG. 1, the light-transmitting electrode layer 170 includes an opening region formed by removing at least one part of layers, and the second electrode layer 180 is disposed in the region such that the second electrode layer 180 contacts at least one region of the second conductive-type semiconductor layer 150.

The second electrode layer 180 may have the same configuration as the first electrode layer 160. That is, the second electrode layer 180 may include an adhesive seed (not shown), a reflective layer (not shown) and a protective layer (not shown), and a wire bonding layer (not shown) that are spaced from one another on the second conductive-type semiconductor layer 150, thus securing thermal stability and high light reflectivity of the second electrode layer 180.

Meanwhile, the second electrode layer 180 may form a Schottky junction with the second conductive-type semiconductor layer 150 realized by a p-type semiconductor layer. The second electrode layer 180 forms a Schottky junction with the second conductive-type semiconductor layer 150, thereby obtaining the effect of a current block layer (CBL) formed between the second electrode layer 180 and the second conductive-type semiconductor layer 150, thus realizing current spreading effects and improving luminous efficacy of the light emitting device 100.

In addition, the first electrode layer 160 and the second electrode layer 180 have identical configurations, thus enabling simultaneous formation of the first electrode layer 160 and the second electrode layer 180 by deposition and simplifying the overall manufacturing process.

Figure 2:
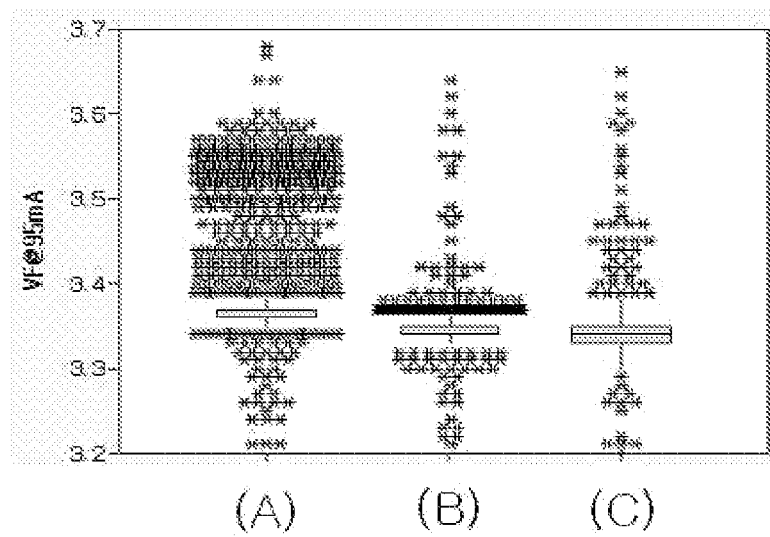
FIG. 2 is a view illustrating Vf of the light emitting device of FIG. 1.
Figure 3:
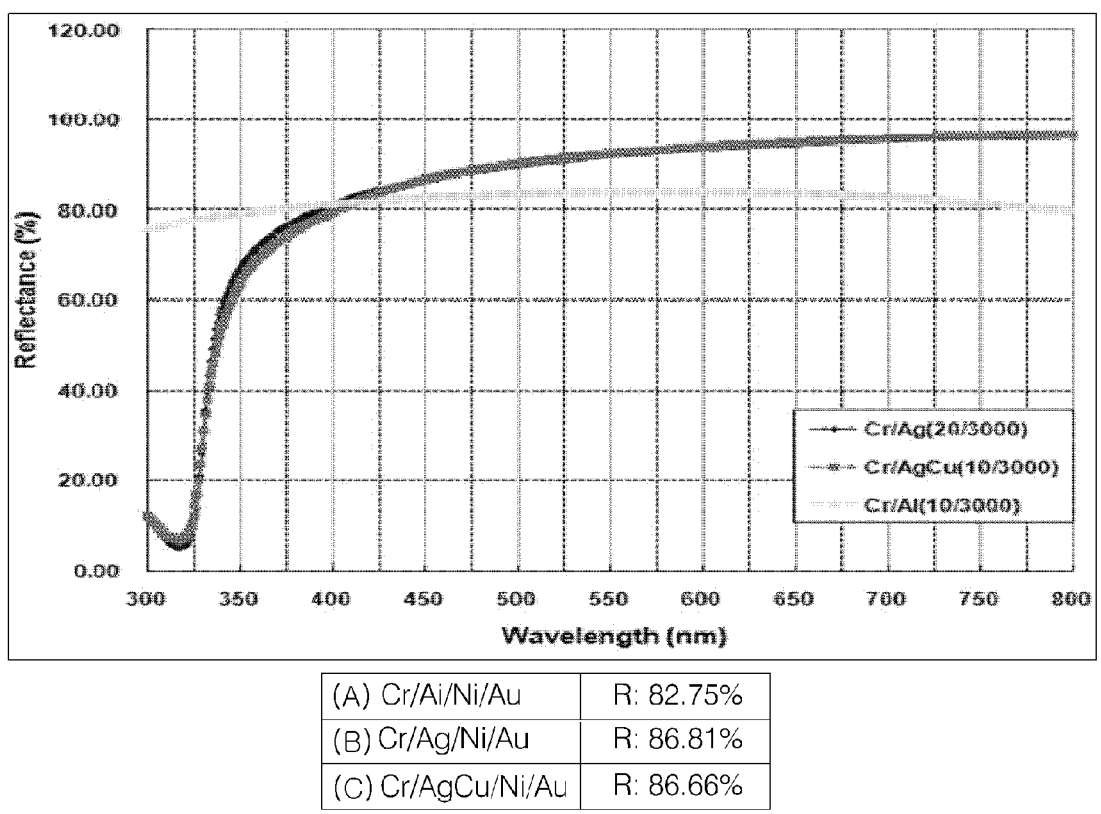
FIG. 3 is a view illustrating light reflectivity of the first electrode layer of FIG. 1.
Figure 4:
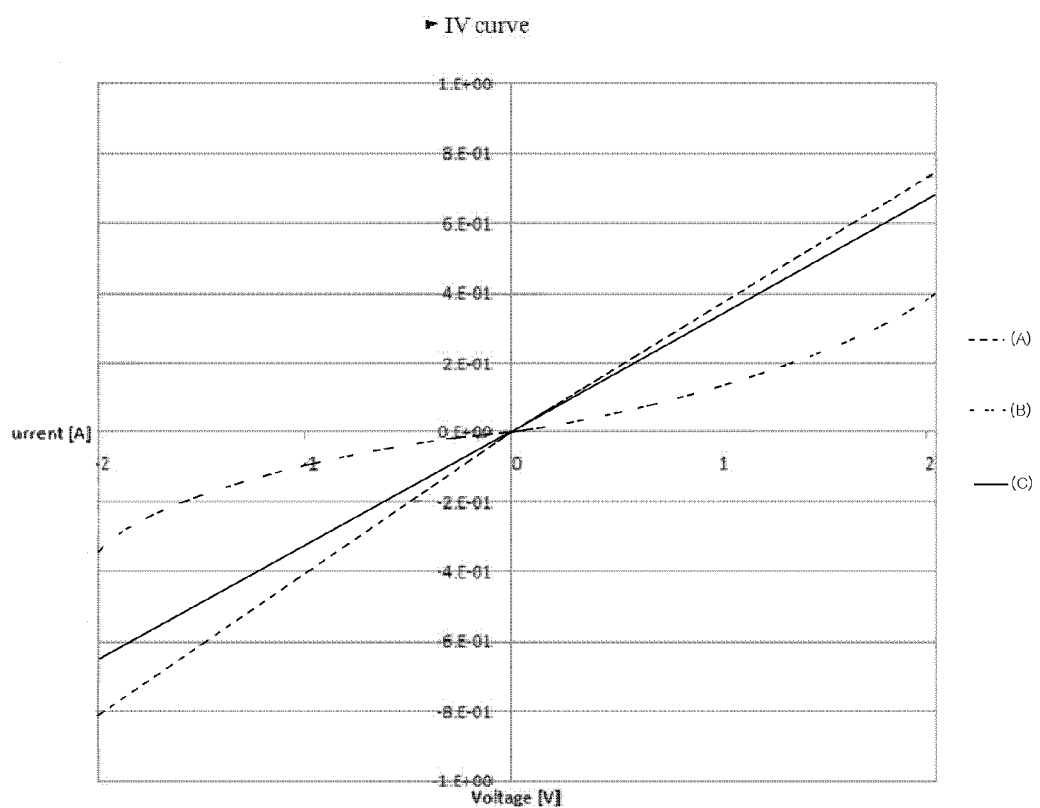
FIG. 4 is a view showing I-V values of the first electrode layer of FIG. 1.

FIG. 2 is a view illustrating Vf of the light emitting device of FIG. 1. FIG. 3 is a view illustrating light reflectivity of the first electrode layer of FIG. 1. FIG. 4 is a view illustrating I-V values of the first electrode layer of FIG. 1.

Here, A of FIGS. 2 to 4 is a case in which the reflective layer 164 of the first electrode layer 160 and the second electrode layer 180 is made of Al, B is a case in which the reflective layer 164 is made of only silver (Ag), and C is a case in which the reflective layer 164 is made of an alloy of silver (Ag) and copper (Cu).

It can be seen from FIG. 2, that B and C in which the reflective layer 164 is made of silver or an Ag alloy exhibit a decrease in Vf, as compared to A in which the reflective layer 164 is made of aluminum. The reason for this is that aluminum undergoes a decrease in Vf during thermal treatment, while silver is free of this problem.

In addition, it can be seen from FIG. 3 that B and C in which the reflective layer 164 is made of silver or an Ag alloy exhibit light reflectivity higher than or equal to A in which the reflective layer 164 is made of aluminum. Therefore, the light emitting device according to this embodiment can maintain superior light reflectivity and improve reliability of devices.

Meanwhile, FIG. 4 shows an I-V curve of the first electrode layer 160 of FIG. 1. From FIG. 4, it can be seen that B exhibits superior ohmic contact properties to A and C. The reason for this is that, as mentioned above, pure silver does not readily ohmic-contact a first conductive-type semiconductor layer, but the reflective layer 164 is made of an Ag alloy, thus enabling ohmic contact between the first conductive-type semiconductor layer 130 and the first electrode layer 160.

Figure 5:
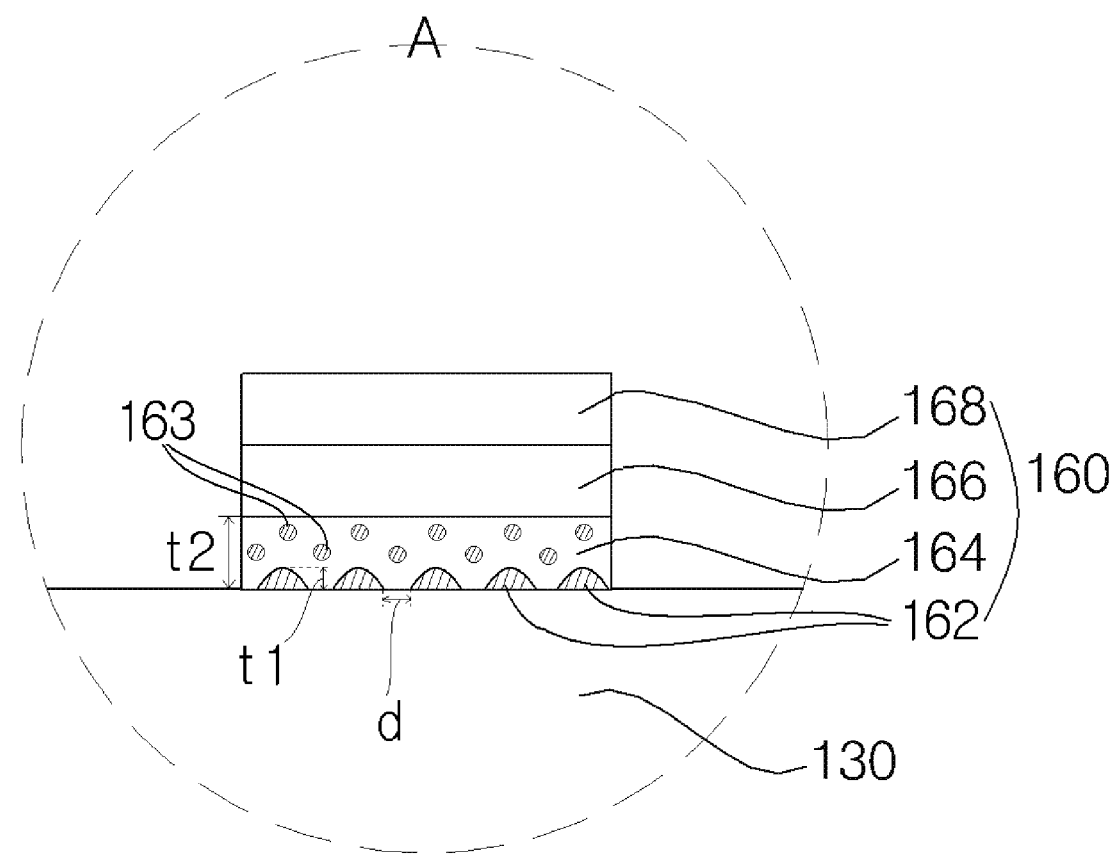
FIG. 5 is a sectional view illustrating a first electrode layer according to another embodiment.

FIG. 5 is a sectional view illustrating a first electrode layer according to another embodiment.

Referring to FIG. 5, the light emitting device 100 according to this embodiment further comprises a seed 163 disposed in the reflective layer 164, as compared to the embodiment of FIG. 1.

A plurality of seeds 163 may be dispersed inside the reflective layer 164. Also, the seeds 163 may be uniformly or non-uniformly distributed inside the reflective layer 164.

The seeds 163 may be present in a variety of forms within the reflective layer 164. Although the seeds 163 having a spherical shape are illustrated in FIG. 5, the shape of the seeds 163 is not limited. That is, the seeds 163 may form a solid solution within the reflective layer 164 or form a compound with a material constituting the reflective layer 164.

The seed 163 contains at least one of Cr, Ti, V, Ta and Al.

The seed 163 may be formed by mixing with a reflective layer 164, followed by heating, but the formation method of the seed 163 is not limited thereto.

The thickness ($t_1$) of the adhesive seed 162 is not limited. When the thickness is excessively large, reflectivity of the electrode is disadvantageously deteriorated, and when the thickness is excessively small, adhesive force between the electrode and the semiconductor layer is deteriorated. Accordingly, the thickness of the adhesive seed 162 may be 1 nm to 10 nm.

The pitch d between the plurality of adhesive seeds 162 may be uniform or non-uniform, but may be 0.5 to 2 times the width of the adhesive seed 162. The reason for this is that when the pitch d between the plurality of adhesive seeds 162 is excessively large, adhesive force between the electrode and the semiconductor layer is deteriorated, and when the pitch is excessively small, reflectivity of the electrode is deteriorated.

The thickness ($t_2$) of the reflective layer 164 may be 10 nm to 20 nm greater than that of the adhesive seed 162, but is not limited thereto.

Figure 6:
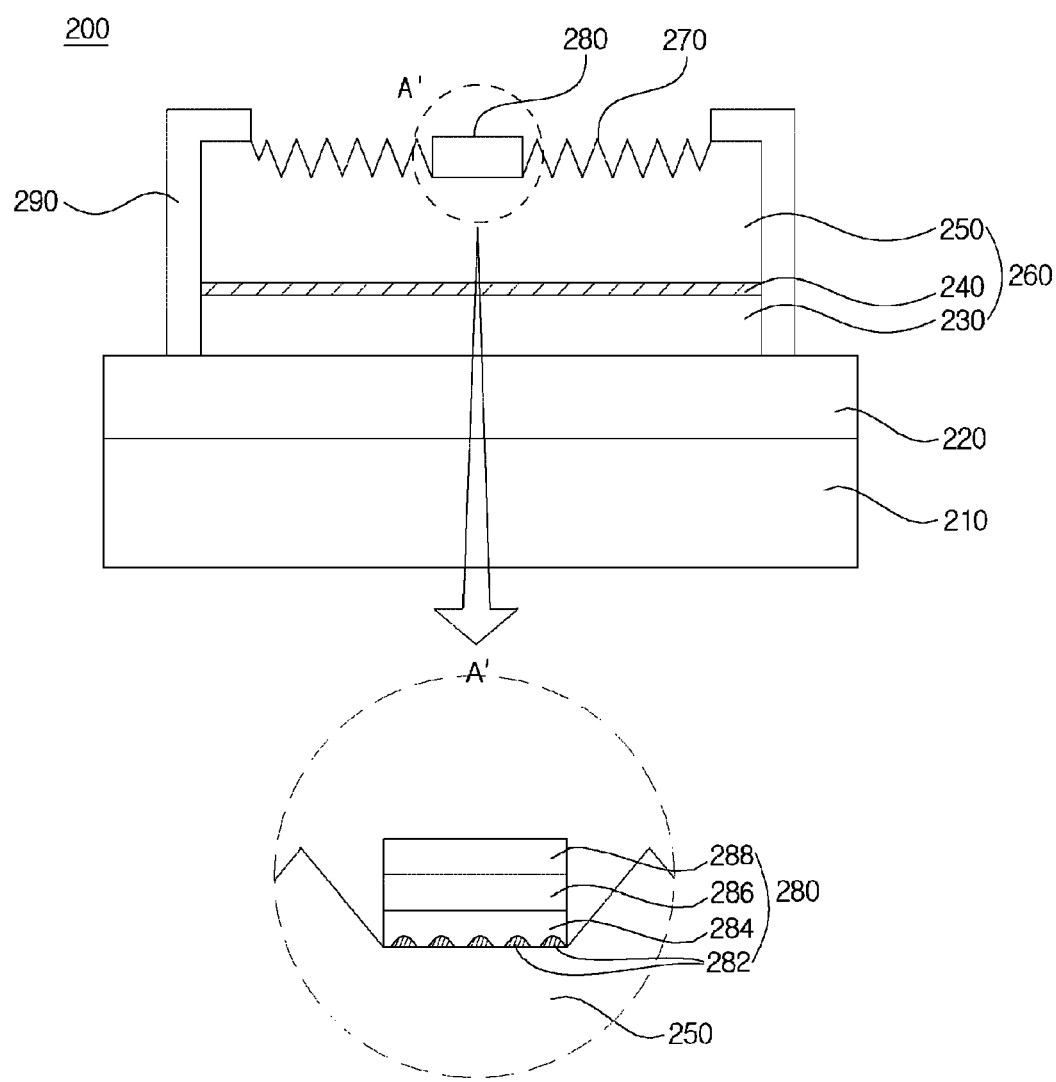
FIG. 6 is a sectional view illustrating a light emitting device according to one embodiment.

FIG. 6 is a sectional view illustrating a light emitting device according to one embodiment.

Referring to FIG. 6, the light emitting device 200 according to this embodiment includes a substrate 210, a light emitting structure 260 including a first electrode layer 220, a first conductive-type semiconductor layer 230 an active layer 240, and a second conductive-type semiconductor layer 250 disposed on the substrate 210, and a second electrode layer 280.

The substrate 210 may be made of a material with superior thermal conductivity or a conductive material and may be a metal material or conductive ceramic. The substrate 210 may be a single layer, a double layer or a multi layer including three or more layers.

That is, the substrate 210 may be formed of one selected from Au, Ni, W, Mo, Cu, Al, Ta, Ag, Pt, and Cr, or an alloy thereof, or may be formed by laminating including two or more different materials. In addition, the substrate 210 may be realized with a carrier wafer such as Si, Ge, GaAs, ZnO, SiC, SiGe, GaN, and $Ga_2O_3$.

Such a substrate 210 facilitates emission of heat generated by the light emitting device 200, thus improving thermal stability of the light emitting device 200.

Meanwhile, the first electrode layer 220 may be disposed between the substrate 210 and the light emitting structure 260, and the second electrode layer 280 may be disposed on the light emitting structure 260. The first electrode layer 220 and the second electrode layer 280 are disposed to constitute a multi-layer structure, as mentioned below.

The light emitting structure 260 includes at least a first conductive-type semiconductor layer 230, an active layer 240 and a second conductive-type semiconductor layer 250, and the active layer 240 is interposed between the first conductive-type semiconductor layer 230 and the second conductive-type semiconductor layer 250.

The first conductive-type semiconductor layer 230 may be disposed on the first electrode layer 220. The first conductive-type semiconductor layer 230 may be realized with a p-type semiconductor layer doped with a p-type dopant. The p-type semiconductor layer may be selected from semiconductor materials having a formula of $In_xAl_yGa_{1-x-y}N$ ($0 \le x \le 1$, $0 \le y \le 1$, $0 \le x+y \le 1$) such as GaN, AlN, AlGaN, InGaN, InN, InAlGaN, AlInN, and may be doped with a p-type dopant such as Mg, Zn, Ca, Sr and Ba.

The active layer 240 may be disposed on the first conductive-type semiconductor layer 230. The active layer 240 may be formed with a mono- or multi-quantum well structure, a quantum wire structure, a quantum dot structure or the like using a compound semiconductor material containing group III-V elements.

In the case where the active layer 240 has a quantum well structure, for example, it may have a single or multi-quantum well structure including a well layer having the formula of $In_xAl_yGa_{1-x-y}N$ ($0 \le x \le 1$, $0 \le y \le 1$, $0 \le x+y \le 1$) and a barrier layer having the formula of $In_aAl_bGa_{1-a-b}N$ ($0 \le a \le 1$, $0 \le b \le 1$, $0 \le a+b \le 1$). The well layer may be formed of a material having a band gap smaller than that of the barrier layer.

A conductive clad layer (not shown) may be disposed on and/or under the active layer 240. The conductive clad layer (not shown) may be formed of an AlGaN-based semiconductor, and may have a greater band gap than the active layer 240.

Meanwhile, an intermediate layer (not shown) may be disposed between the active layer 240 and the first conductive-type semiconductor layer 230, and the intermediate layer (not shown) may be an electron blocking layer that prevents a phenomenon in which electrons injected into the active layer 240 from the second conductive-type semiconductor layer 250 when a high current is applied are not recombined in the active layer 240 and flow to the first conductive-type semiconductor layer 230. The intermediate layer (not shown) has a larger band gap than the active layer 240, thereby preventing the phenomenon in which electrons injected into the active layer 240 from the second conductive-type semiconductor layer 250 when a high current is applied are not recombined in the active layer 240 and flow to the first conductive-type semiconductor layer 230. As a result, probability of recombination of electrons and holes in the active layer 240 can be improved and leakage current can be suppressed.

Meanwhile, the intermediate layer (not shown) may have a larger band gap than that of barrier layer contained in the active layer 240, and may be a semiconductor layer containing Al such as AlGaN, without being limited thereto.

The second conductive-type semiconductor layer 250 may be disposed on the active layer 240. The second conductive-type semiconductor layer 250 may be an n-type semiconductor layer, and the n-type semiconductor layer may be selected from semiconductor materials such as GaN, AlN, AlGaN, InGaN, InN, InAlGaN and AlInN having the formula of $In_xAl_yGa_{1-x-y}N$ ($0 \le x \le 1$, $0 \le y \le 1$, $0 \le x+y \le 1$), and be doped with an n-type dopant such as Si, Ge, Sn, Se and Te.

Meanwhile, the light emitting structure 260 may further include another semiconductor layer (not shown) with a polarity opposite that of the first semiconductor layer 120 on the second conductive-type semiconductor layer 250. In addition, the first conductive-type semiconductor layer 230 may be realized with an n-type semiconductor layer and the second conductive-type semiconductor layer 250 may be realized with a p-type semiconductor layer. As a result, the light emitting structure layer 270 may contain at least one of N-P junction, P-N junction, N-P-N junction and P-N-P junction structures.

A light extraction structure 270 may be disposed on the light emitting structure 260.

The light extraction structure 270 may be formed on the upper surface of the second conductive-type semiconductor layer 250, or may be obtained by forming a light transmitting layer (not shown) on the light emitting structure 260 and forming the light extraction structure 270 on the light transmitting layer (not shown), but the position thereof is not limited thereto.

The light extraction structure 270 may be disposed in partial regions or over the entirety of the first conductive semiconductor layer 151. The light extraction structure 270 may be formed by etching at least one region of the upper surface of the first conductive semiconductor layer 151 and the formation method is not limited thereto. The etching process includes a wet and/or dry etching process. After the etching process, the upper surface of a light-transmitting electrode layer (not shown) or the upper surface of the first conductive semiconductor layer 151 may have roughness which constitutes the light extraction structure 270. The roughness having a random size may be irregularly formed, but is not limited thereto. The roughness includes at least one of a texture pattern, a concave-convex pattern and an uneven pattern.

The cross-section of the roughness may have various shapes, such as a cylinder, a polyprism, a cone, a polypyramid, a circular truncated cone and a frustum of a pyramid, and preferably has a conical or polypyramidal shape.

Meanwhile, the light extraction structure 270 may be formed by a photo-electro chemical (PEC) method, but formation of the light extraction structure 270 is not limited thereto. When the light extraction structure 270 is formed on the upper surface of the light-transmitting electrode layer (not shown) or the second conductive-type electrode 250, it is possible to prevent a phenomenon in which light generated by the active layer 240 from the active layer 240 undergoes total reflection of the light from the upper surface of the light transmitting electrode layer (not shown) or the second conductive-type semiconductor layer 250, and are thus reabsorbed or scattered and thereby contribute to improvement of light extraction efficiency of the light-emitting device 200.

A passivation layer 290 may be disposed at the side surface or upper region of the light emitting structure 260 and the passivation layer 290 may be made of an insulating material.

A second electrode layer 280 electrically connected to the second conductive-type semiconductor layer 250 may be disposed on the light emitting structure 260 and the second electrode layer 280 may include at least one pad and/or at least one electrode having a predetermined pattern. The second electrode layer 280 may be disposed in central, peripheral or corner regions on the upper surface of the second conductive-type semiconductor layer 250 and the position of the second electrode layer 280 is not limited thereto. The second electrode layer 280 may be disposed in regions other than the upper parts of the second conductive-type semiconductor layer 250, but the position thereof is not limited thereto.

Meanwhile, referring to part A' of FIG. 6, the second electrode layer 280 may include an adhesive seed 282, a reflective layer 284, and a protective layer 286 and, as mentioned below, may further include a wire bonding layer 288 to which wires are connected during manufacture of the light emitting device package (not shown).

A plurality of adhesive seeds 282 may be spaced from one another on the light emitting structure 260. For example, as shown in FIG. 6, the adhesive seeds 282 may be disposed on the upper surface of the exposed first conductive-type semiconductor layer 250.

The adhesive seed 282 is formed of at least one of Cr, Ti, V, Ta and Al, improves adhesive force between the second electrode layer 280 and the second conductive-type semiconductor layer 250 and suppresses excessive diffusion and movement of silver contained in the reflective layer 284. In addition, the protective layer 286 is formed of at least one of Cr, Ti, Ni, Pd, Pt, W, Co, and Cu, and suppresses excessive injection of exterior oxygen and excessive diffusion of silver particles and thereby prevents aggregation and emptiness of silver.

Meanwhile, the adhesive seed 282, the reflective layer 284, and the protective layer 286 may be sequentially deposited, or simultaneously formed, without being limited thereto.

In addition, the adhesive seed 282 may be a solid solution produced in the process of forming a thin film on the first conductive-type semiconductor layer 250 and heating the same.

When the second electrode layer 280 is subjected to thermal treatment, silver alloy particles diffused into the reflective layer 284 and particles of Ga or the like diffused into the second conductive-type semiconductor layer 250 undergo metallization at the interface between the second electrode layer 280 and the second conductive-type semiconductor layer 250 and a low contact resistance and strong adhesive force can thus be imparted to the second electrode layer 280.

In addition, since silver does not undergo galvanic corrosion or the like, and the adhesive seed 282 and the protective layer 286 prevent excessive diffusion of silver particles by thermal treatment, the second electrode layer 280 can maintain high reflectivity, an inherent property of silver.

The reflective layer 284 may be made of an Ag alloy.

The reflective layer 284 contains silver (Ag) with high reflectivity, thereby improving light extraction efficiency to the outside. In addition, by forming the reflective layer 284 with an Ag alloy, it is possible to prevent decrease in Vf caused by thermal treatment of the second electrode layer 280, and galvanic corrosion caused by contact potential difference or the like.

Meanwhile, when the second conductive-type semiconductor layer 250 is realized with an n-type semiconductor layer and the reflective layer 284 is made of silver, formation of ohmic contact between the second electrode layer 280 and the second conductive-type semiconductor layer 250 may be difficult. However, the reflective layer 284 contains an Ag alloy, thereby securing high reflectivity based on Ag, and forming ohmic contact between the second conductive-type semiconductor layer 250 and the second electrode layer 280.

Meanwhile, the Ag alloy of the second electrode layer 280 contains silver (Ag) and at least one of Cu, Re, Bi, Al, Zn, W, Sn, In and Ni, without being limited thereto.

The thickness of the reflective layer 284 is not limited and may be greater than that of the adhesive seed 162.

The reflective layer 284 may be disposed such that it contacts the light emitting structure 120. That is, as shown in FIG. 1, one part of the reflective layer 284 may contact the first conductive-type semiconductor layer 130. The one part of the reflective layer 164 may come into ohmic-contact with the first conductive-type semiconductor layer 130.

Meanwhile, the wire bonding layer 288 may be formed so that wire connected for application of exterior power is bonded, when the light emitting device 200 is mounted on the light emitting device package (not shown). Meanwhile, the wire bonding layer 288 may be formed of gold, or the like, without being limited thereto.

Meanwhile, the first electrode layer 220 may be disposed between the light emitting structure 260 and the substrate 210.

The first electrode layer 220 may have a multi-layer structure and may for example include an adhesive seed (not shown) such as a second electrode layer 280, a reflective layer (not shown), and a protective layer (not shown).

For example, the first electrode 220 may have a structure of reflective layer/protective layer/adhesive seed, or of adhesive seed/reflective layer/protective layer laminated in this order from the bottom, or may have a structure in which the reflective layer and the protective layer may be interposed between the adhesive seeds, the protective layer is interposed between the adhesive seeds and the reflective layer is interposed the protective layers, without being limited thereto.

Meanwhile, as mentioned above, the reflective layer may be made of an Ag alloy containing silver (Ag), thus imparting thermal stability and high light reflectivity to the second electrode layer 280.

In addition, the light-transmitting electrode layer (not shown) is disposed between the first electrode layer 220 and the light emitting structure 260.

The light-transmitting electrode layer (not shown) contains at least one of ITO, IZO(In—ZnO), GZO(Ga—ZnO), AZO (Al—ZnO), AGZO(Al—Ga ZnO), IGZO(In—Ga ZnO), IrOx, RuOx, RuOx/ITO, Ni/IrOx/Au and Ni/IrOx/Au/ITO and distributes power applied from the outside, thereby supplying the same to the first conductive-type semiconductor layer 230.

Figure 7:
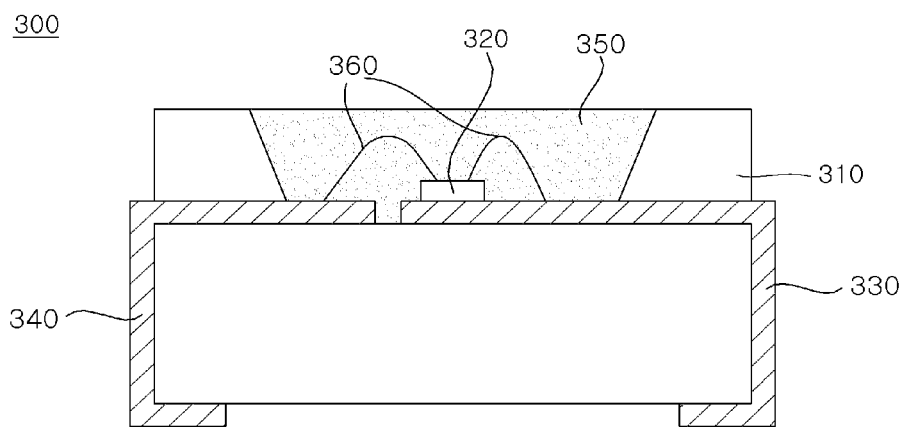
FIG. 7 is a sectional view illustrating a light emitting device package according to one embodiment.

FIG. 7 is a sectional view illustrating a light emitting device package according to this embodiment.

Referring to FIG. 7, the light-emitting device package 300 according to this embodiment includes a body 310 provided with a cavity 320, a light source portion 320 mounted on the body 310, and a sealant 350 filling the cavity.

The body 310 may be composed of at least one selected from resin materials such as polyphthalamide (PPA), silicon (Si), aluminum (Al), aluminum nitride (AlN), photo sensitive glass (PSG), polyamide9T (PA9T), syndiotactic polystyrene (SPS), metal materials, sapphire ($Al_2O_3$), beryllium oxide (BeO) and printed circuit boards (PCB). The body 310 may be formed by a process such as injection molding and etching, without being limited thereto.

The light source portion 320 is mounted on the bottom of the body 310 and for example the light source portion 320 may be a light emitting device as illustrated and described in FIG. 1. The light emitting device is, for example, a color light emitting device that emits light of a color such as red, green, blue or white, or a UV (ultraviolet) emitting device that emits UV light, without being limited thereto. In addition, one or more light emitting devices may be mounted.

The body 310 includes a first electrode layer (not shown) and a second electrode layer (not shown), the first electrode layer (not shown) and the second electrode layer (not shown) are connected to the first electrode 330 and the second electrode 340, respectively. The first electrode 330 and the second electrode 340 are electrically connected to the light source portion 320 and thus supply power to the light source portion 320.

In addition, the first electrode 330 and the second electrode 340 are electrically separated from each other, and reflect light generated by the light source portion 320 and thereby improve luminous efficacy, and discharge heat generated by the light source portion 320 to the outside.

The first electrode 330 and the second electrode 340 may be bonded to the light source portion 320 through a wire 360. The wire 360 may be connected to a wire bonding layer (not shown) included in the light source portion 320. Meanwhile, a case in which the first electrode 330 and second electrode 340 are connected to the wire 360 is illustrated in FIG. 6, without being limited thereto. In a vertical-type light emitting device, one of the first electrode 330 and the second electrode 340 may be bonded to the light source portion 320 through the wire 360 and, as shown in FIG. 7, the light source portion 320 may be connected to the electrodes without the wire 360 by a flip chip method.

The first electrode 330 and the second electrode 340 may contain a metal material selected from titanium (Ti), copper (Cu), nickel (Ni), gold (Au), chrome (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru), iron (Fe), and an alloy thereof. In addition, the first electrode 330 and the second electrode 340 may have a monolayer or multilayer structure, but are not limited thereto.

The sealant 350 fills the cavity and contains a phosphor (not shown). The sealant 350 may be composed of silicon, epoxy or other resin material and may be formed by filling the material with a sealant, followed by UV or heat curing.

In addition, the type of the phosphor (not shown) may be selected, depending on the wavelength of light emitted from the light source portion 320 to allow the light-emitting device package 300 to render white light.

Depending on the wavelength of light emitted from the light source portion 320, the phosphor (not shown) included in the sealant 350 may be at least one of blue light-emitting phosphors, bluish green light-emitting phosphors, green light-emitting phosphors, yellowish green light-emitting phosphors, yellow light-emitting phosphors, yellowish red light-emitting phosphors, orange light-emitting phosphors, and red light-emitting phosphors.

That is, the phosphor (not shown) is excited by a first light emitted from the light source portion 350 to produce second light. For example, in the case where the light source portion 320 is a blue light-emitting diode and the phosphor is a yellow phosphor, the yellow phosphor is excited by blue light to emit yellow light, blue light emitted from the blue light-emitting diode is mixed with yellow light that is excited and thus produced by blue light, to allow the light-emitting device package 300 to render white light.

Figure 8:
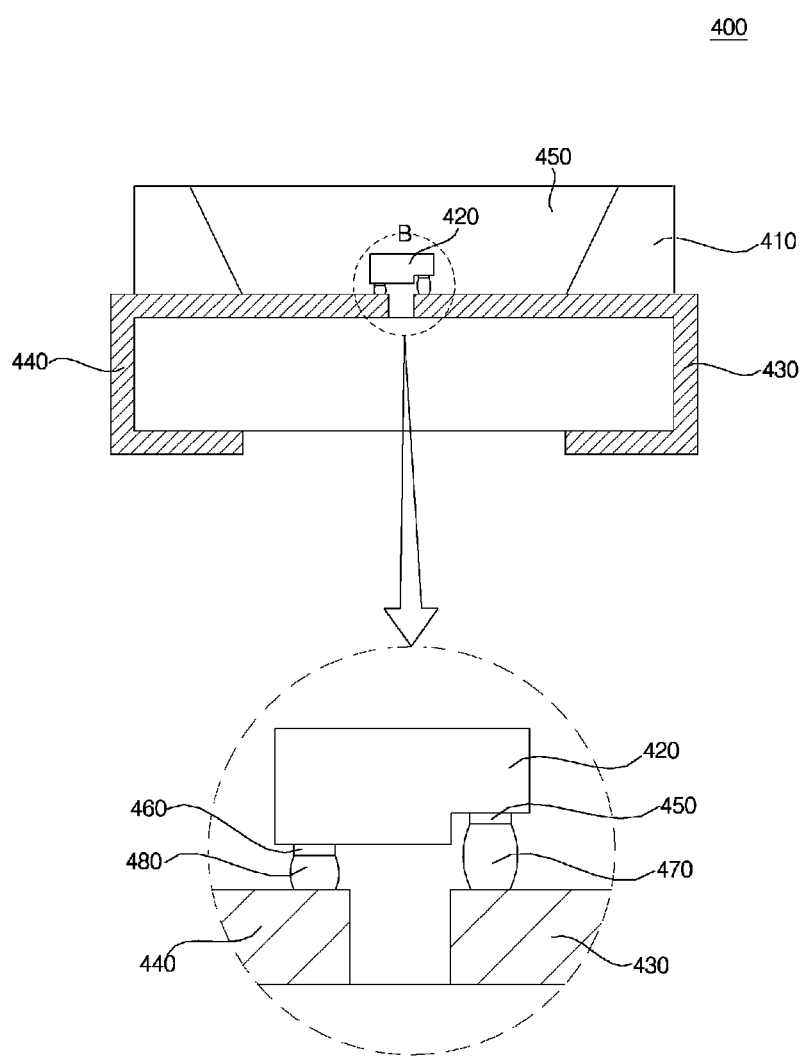
FIG. 8 is a sectional view illustrating a light emitting device package according to another embodiment.

FIG. 8 is a sectional view illustrating a light emitting device package according to one embodiment.

Referring to FIG. 8, the light-emitting device package 400 according to this embodiment includes a body 410 provided with a cavity 420, a light source portion 420 mounted on the body 410, and a sealant 450 filling the cavity. The body 410, the light source portion 420 and sealant 450 and the like are as described in FIG. 7 above and a detailed description thereof is thus omitted.

Referring to FIG. 8, the light source portion 420 may be connected to the first electrode 430 and the second electrode 440 by a flip chip method. The light source portion 420 may be a light emitting device as illustrated and described in FIG. 1, and the light source portion 420 may include a first electrode layer 450 and a second electrode layer 460.

The first electrode layer 450 may be connected to the first electrode 430 through a first solder 470 and the second electrode layer 460 may be connected to the second electrode 440 through a second solder 480. Such soldering may be carried out by eutectic bonding or the like.

The eutectic bonding or the like may be carried out by thermal treatment, but, according to embodiments, the first electrode layer 450 and the second electrode layer 460 include a reflective layer containing an Ag alloy, thus maintaining superior junction force and light reflectivity without an increase in Vf in spite of performing thermal treatment.

In addition, although not shown in drawings, for more efficient emission of light, the reflective layer (not shown) may be formed on the body 410 using a metal having a high reflectance such as silver (Ag) or aluminum (Al) and an insulating layer (not shown) may be further formed on the reflective layer (not shown) in order to prevent electric contact between the reflective layer (not shown) and the first electrode 450 and the second electrode 460.

The light emitting device package according to this embodiment is arrayed in plural on the substrate and an optical member such as a light guide plate, prism sheet and diffusion sheet may be disposed on a light passage of the light emitting device package. The light emitting device package, the substrate and the optical member may serve as a light unit. In another embodiment, a display device, an indicating device and a lighting device including the light emitting device or light emitting device package disclosed in the afore-mentioned embodiments may be realized. For example, the lighting device may include a lamp, a streetlamp, or the like.

Figure 9:
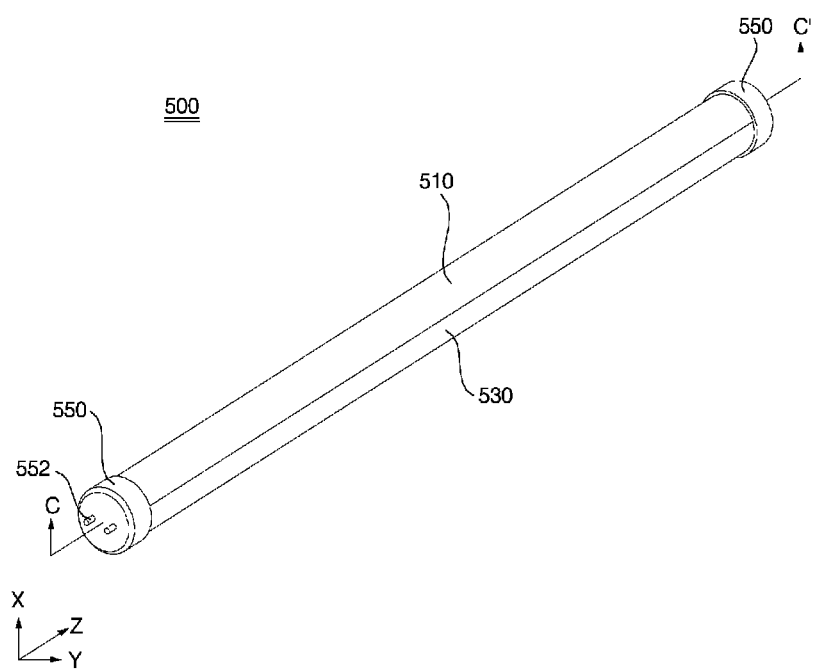
FIG. 9 is a perspective view illustrating a lighting device including the light emitting device according to one embodiment.
Figure 10:
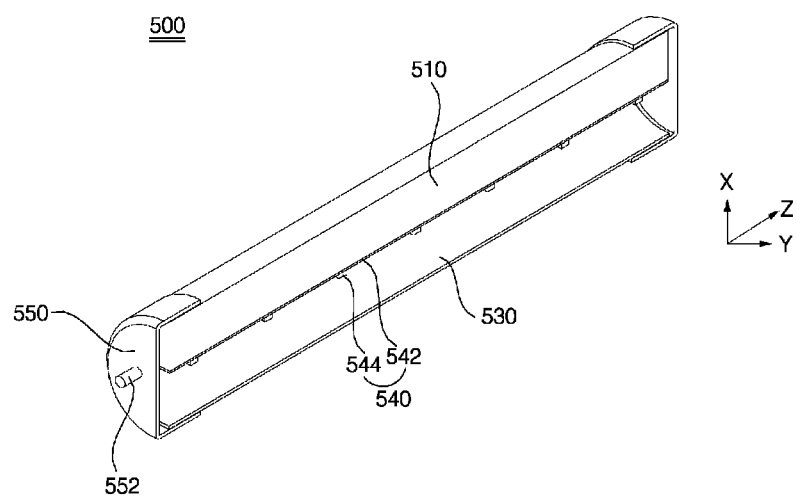
FIG. 10 is a sectional view illustrating the cross-section of C-C' of the lighting device of FIG. 9.

FIG. 9 is a perspective view illustrating a lighting device including the light emitting device according to one embodiment. FIG. 10 is a sectional view illustrating the cross-section of C-C' of the lighting device of FIG. 9.

Referring to FIGS. 9 and 10, the lighting device 500 may include a body 510, a cover 530 connected to the body 510 and an end cap 550 disposed at both ends of the body 510.

A light emitting device module 540 is coupled to the upper surface of the body 510 and the body 510 may be composed of a metal material which exhibits superior conductivity and heat dissipation effects in order to discharge heat generated from the light emitting device package 544 to the outside through the top of the body 610.

The light emitting device packages 544 are mounted on the PCB 542 in multiple colors and multiple rows to constitute an array, and may be spaced from one another by a predetermined distance or by different distances, as necessary, to control brightness. The PCB 542 may be a metal core PCB (MPPCB) or PCB made of FR4.

Meanwhile, the light emitting device package 544 according this embodiment includes a light emitting device (not shown), and the light emitting device (not shown) includes an electrode (not shown) containing a silver alloy, thereby improving luminous brightness and reliability of the light emitting device (not shown) and the lighting device (not shown).

The cover 530 may take the shape of a circle to surround the bottom of the body 510, without being limited thereto.

The cover 530 protects the light emitting device module 540 from foreign substances. In addition, the cover 530 includes diffusion particles to prevent glare generated from the light emitting device package 544 and to uniformly discharge light to the outside. In addition, a prism pattern or the like may be formed on at least one of the inner and outer surfaces of the cover 530. Alternatively, a phosphor may be applied to at least one of the inner and outer surfaces of the cover 530.

Meanwhile, the cover 530 should exhibit superior light transmittance, in order to discharge light generated from the light emitting device package 544 through the cover 530 to the outside, and the cover 530 should exhibit sufficient heat resistance in order to endure heat emitted by the light emitting device package 544. Preferably, the cover 530 is composed of a material including polyethylene terephthalate (PET), polycarbonate (PC), polymethyl methacrylate (PMMA) or the like.

The end cap 550 is disposed on both ends of the body 510 and may be used to seal a power supply device (not shown). In addition, the end cap 550 is provided with a power pin 552, allowing the lighting device 500 to be applied to a conventional terminal from which a fluorescent light has been removed, without using any additional device.

Figure 11:
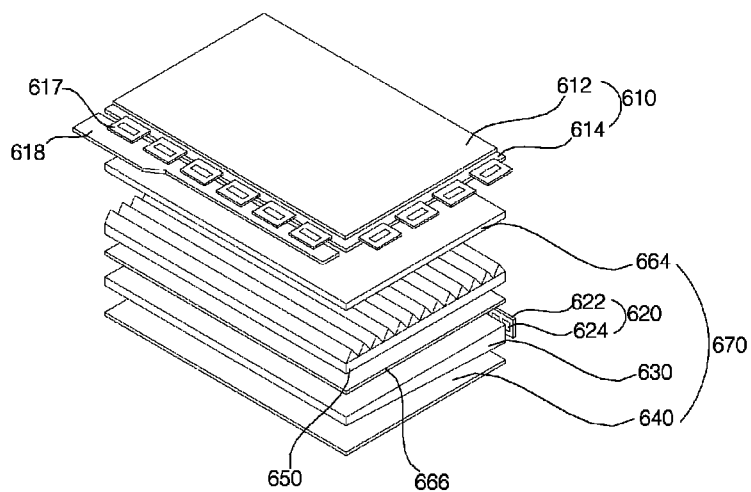
FIG. 11 is an exploded perspective view illustrating a liquid crystal display including the light emitting device according to one embodiment.

FIG. 11 is an exploded perspective view illustrating a liquid crystal display including the light emitting device according to one embodiment.

FIG. 11 illustrates an edge-light type liquid crystal display device 600 which includes a liquid crystal display panel 610 and a backlight unit 670 to supply light to the liquid crystal display panel 610.

The liquid crystal display panel 610 displays an image using light supplied from the backlight unit 670. The liquid crystal display panel 610 includes a color filter substrate 612 and a thin film transistor substrate 614 which face each other such that liquid crystal is interposed therebetween.

The color filter substrate 612 can realize color of images to be displayed through the liquid crystal display panel 610.

The thin film transistor substrate 614 is electrically connected to a printed circuit board 618 on which a plurality of circuit components are mounted through a driving film 617. In response to drive signals supplied from the printed circuit board 618, the thin film transistor substrate 614 may apply a drive voltage from the printed circuit board 618 to liquid crystals.

The thin film transistor substrate 614 includes a thin film transistor and a pixel electrode formed as a thin film on another substrate composed of a transparent material such as glass or plastic.

The backlight unit 670 includes a light emitting device module 620, a light guide plate 630 to convert light emitted from the light emitting device module 620 into surface light and supply the light to the liquid crystal display panel 610, a plurality of films 650, 666 and 664 to uniformize brightness of light from the light guide plate 630 and improve vertical incidence, and a reflective sheet 640 to reflect light emitted to the back of the light guide plate 630 to the light guide plate 630.

The light emitting device module 620 includes a plurality of light emitting device packages 624 and a PCB substrate 622 on which the light emitting device packages 624 are mounted to form an array.

Meanwhile, the light emitting device package 624 according to this embodiment includes a light emitting device (not shown) and the light emitting device (not shown) includes an electrode (not shown) containing a silver alloy, thus improving brightness and reliability of the light emitting device (not shown) and the backlight unit 670.

Meanwhile, the backlight unit 670 includes a diffusion film 666 to diffuse light incident from the light guide plate 630 toward the liquid crystal display panel 610, a prism film 650 to concentrate the diffused light and thus improve vertical incidence and a protective film 664 to protect the prism film 650.

Figure 12:
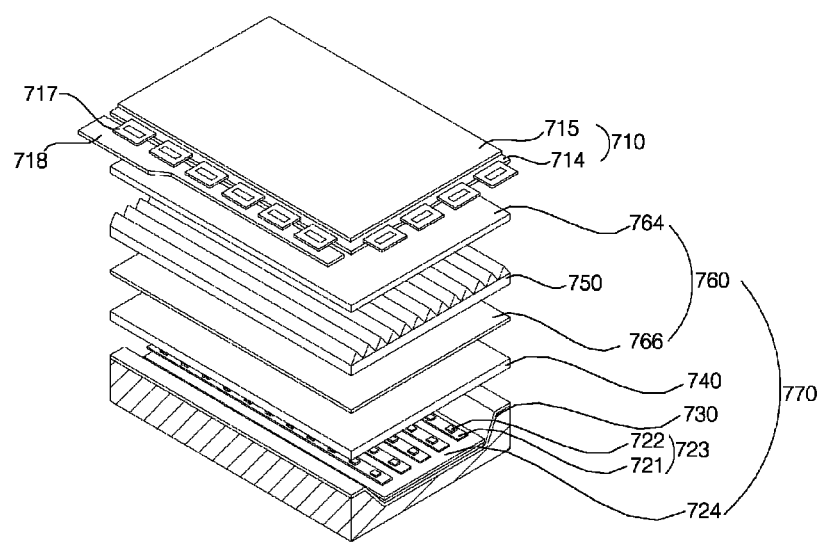
FIG. 12 is an exploded perspective view illustrating a liquid crystal display including the light emitting device according to one embodiment.

FIG. 12 is an exploded perspective view illustrating a liquid crystal display including the light emitting device according to one embodiment. The contents illustrated and described in FIG. 11 are not mentioned in detail.

FIG. 12 illustrates a direct-type liquid crystal display device 700 which includes a liquid crystal display panel 710 and a backlight unit 770 to supply light to the liquid crystal display panel 710.

The liquid crystal display panel 710 has been described with reference to FIG. 11 and a detailed explanation thereof is thus omitted.

The backlight unit 770 includes a plurality of light emitting device modules 723, a reflective sheet 724, a lower chassis 730 in which the light emitting device module 723 and the reflective sheet 724 are accepted, a diffusion plate 740 disposed on the light emitting device module 723, and a plurality of optical films 760.

The light emitting device module 723 includes a PCB 721 that enables a plurality of light emitting device packages 724 to be mounted and thereby to form an array.

Meanwhile, the light emitting device package 724 according to this embodiment includes a light emitting device (not shown) and the light emitting device (not shown) includes an electrode (not shown) containing a silver alloy, thus improving brightness and reliability of the light emitting device (not shown) and the backlight unit 770.

The reflective sheet 724 reflects light generated by the light emitting device package 722 toward the liquid crystal display panel 710 to improve luminous efficacy.

Meanwhile, light emitted from the light emitting device module 723 is incident on the diffusion plate 740 and an optical film 760 is disposed on the diffusion plate 740. The optical film 760 includes a diffusion film 766, a prism film 750 and a protective film 764.

According to these embodiments, the electrode layer of light emitting layer includes a reflective layer composed of a silver alloy, thereby improving reflectivity and electrical properties of the electrode layer and thus luminous efficacy and reliability of the light emitting device.

The features, structures and effects illustrated in the above embodiments may be included in at least one embodiment but are not limited to one embodiment. Further, those skilled in the art will appreciate that various combinations and modifications of the features, structures and effects illustrated in the respective embodiments are possible. Therefore, it will be understood that these combinations and modifications are covered by the scope of embodiments.

Although the embodiments have been disclosed for illustrative purposes, those skilled in the art will appreciate that various modifications, additions and substitutions are possible, without departing from the scope and spirit of the embodiments as disclosed in the accompanying claims. For example, the respective elements described in detail in the embodiments may be modified. Further, it will be understood that differences relating to these modifications, additions and substitutions are covered by the scope of the embodiments defined in the accompanying claims.

What is claimed is:

1. A light emitting device comprising:
   a light emitting structure including a first conductive-type semiconductor layer, a second conductive-type semiconductor layer and an active layer interposed between the first conductive-type semiconductor layer and the second conductive-type semiconductor layer;
   a first electrode layer electrically connected to the first conductive-type semiconductor layer; and
   a second electrode layer disposed on the second conductive-type semiconductor layer,
   wherein the second electrode layer includes:
   a plurality of adhesive seeds spaced from one another on the light emitting structure;
   a reflective layer disposed on the plurality of adhesive seeds; and
   a protective layer disposed on the reflective layer,
   wherein the reflective layer contains silver (Ag) or an Ag alloy.

2. The light emitting device according to claim 1, wherein the first electrode layer is disposed on the upper surface of the first conductive-type semiconductor layer of which the upper surface is partially exposed,
   the first electrode layer includes:
   a plurality of adhesive seeds spaced from one another on the light emitting structure;
   a reflective layer disposed on the adhesive seeds; and
   a protective layer disposed on the reflective layer,
   wherein the reflective layer contains silver (Ag) or an Ag alloy.

3. The light emitting device according to claim 1, wherein the reflective layer contacts the light emitting structure.

4. The light emitting device according to claim 1, wherein a thickness of the reflective layer is larger than a thickness of the adhesive seed.

5. The light emitting device according to claim 1, wherein the thickness of the reflective layer is 10 nm to 20 nm.

6. The light emitting device according to claim 1, wherein the Ag alloy contains silver and at least one of Cu, Re, Bi, Al, Zn, W, Sn, In and Ni.

7. The light emitting device according to claim 1, wherein a thickness of the adhesive seed is 1 nm to 10 nm.

8. The light emitting device according to claim 1, wherein a pitch between the adhesive seeds is 0.5- to 2-fold a width of the adhesive seed.

9. The light emitting device according to claim 1, wherein the adhesive seeds contain a solid solution.

10. The light emitting device according to claim 1, wherein the reflective layer includes a plurality of seeds distributed therein.

11. The light emitting device according to claim 1, wherein the first conductive-type semiconductor layer is an n-type semiconductor layer and the first conductive-type semiconductor layer and the first electrode layer constitute an ohmic contact.

12. The light emitting device according to claim 1, wherein the adhesive seeds or seeds contain at least one of Cr, Ti, V, Ta and Al.

13. The light emitting device according to claim 1, wherein the protective layer contains at least one of Cr, Ti, Ni, Pd, Pt, W, Co, and Cu.

14. The light emitting device according to claim 1, further comprising a wire bonding layer disposed on the protective layer.

15. The light emitting device according to claim 2, further comprising:
   a light transmitting layer disposed on the second conductive-type semiconductor layer,
   wherein the second electrode layer is disposed on the light transmitting layer.

16. The light emitting device according to claim 1, wherein the second conductive-type semiconductor layer and the second electrode layer constitute a schottky junction.

17. A light emitting device package including a light emitting device, comprising:
   wherein the light emitting device includes:
   a light emitting structure including a first conductive-type semiconductor layer, a second conductive-type semiconductor layer and an active layer interposed between the first conductive-type semiconductor layer and the second conductive-type semiconductor layer;
   a first electrode layer electrically connected to the first conductive-type semiconductor layer; and
   a second electrode layer disposed on the second conductive-type semiconductor layer,
   wherein the second electrode layer includes:
   a plurality of adhesive seeds spaced from one another on the light emitting structure;
   a reflective layer disposed on the adhesive seeds; and
   a protective layer disposed on the reflective layer,
   wherein the reflective layer contains silver (Ag) or an Ag alloy.

18. A lighting device including a light emitting device, comprising:
   wherein the light emitting device includes:
   a light emitting structure including a first conductive-type semiconductor layer, a second conductive-type semiconductor layer and an active layer interposed between the first conductive-type semiconductor layer and the second conductive-type semiconductor layer;
   a first electrode layer electrically connected to the first conductive-type semiconductor layer; and
   a second electrode layer disposed on the second conductive-type semiconductor layer,
   wherein the second electrode layer includes:
   a plurality of adhesive seeds spaced from one another on the light emitting structure;
   a reflective layer disposed on the plurality of adhesive seeds; and
   a protective layer disposed on the reflective layer,
   wherein the reflective layer contains silver (Ag) or an Ag alloy.

19. The light emitting device according to claim 2, wherein the adhesive seeds or seeds contain at least one of Cr, Ti, V, Ta and Al.

20. The light emitting device according to claim 10, wherein the adhesive seeds or seeds contain at least one of Cr, Ti, V, Ta and Al.

* * * * *